United States Patent
Padrones et al.

(10) Patent No.: US 11,193,792 B2
(45) Date of Patent: Dec. 7, 2021

(54) SMART ENERGY AND DATA/INFORMATION METERING SYSTEM AND METHOD

(71) Applicant: PACIFIC GAS AND ELECTRIC COMPANY, San Francisco, CA (US)

(72) Inventors: Ed Padrones, Benicia, CA (US); Earle Davis, Walnut Creek, CA (US); Young D Nguyen, Alameda, CA (US); Shelley Williams, Antioch, CA (US); Alex Yan, Berkeley, CA (US); Quoc Hoang, Walnut Creek, CA (US); Lomi Negash, Concord, CA (US); Albert Pham, Campbell, CA (US); Jimmy Chong, Fremont, CA (US); Tri Q. Nguyen, Milpitas, CA (US); Kulwinder Sharma, Milpitas, CA (US); Alan Jones, Berkeley, CA (US)

(73) Assignee: PACIFIC GAS AND ELECTRIC COMPANY, San Francisco, CA (US)

( * ) Notice: Subject to any disclaimer, the term of this patent is extended or adjusted under 35 U.S.C. 154(b) by 0 days.

(21) Appl. No.: 16/725,784

(22) Filed: Dec. 23, 2019

(65) Prior Publication Data
US 2020/0232815 A1    Jul. 23, 2020

Related U.S. Application Data

(63) Continuation of application No. 15/784,711, filed on Oct. 16, 2017, now Pat. No. 10,514,273.
(Continued)

(51) Int. Cl.
*G01R 22/06*     (2006.01)
*G01D 4/02*      (2006.01)
(Continued)

(52) U.S. Cl.
CPC ............... *G01D 4/02* (2013.01); *G01D 4/002* (2013.01); *G01R 21/00* (2013.01); *G01R 22/063* (2013.01);
(Continued)

(58) Field of Classification Search
CPC ...... G01R 11/24; G01R 11/25; G01R 22/066; G01R 22/068
See application file for complete search history.

(56) References Cited

U.S. PATENT DOCUMENTS 6,088,659 A  *  7/2000  Kelley ................. G06F 16/258
                                                   702/62
6,538,577 B1 *  3/2003  Ehrke .................... G01D 4/002
                                                   340/870.02
(Continued)

FOREIGN PATENT DOCUMENTS

KR   10-2003-0020001 A    3/2003
KR   10-2008-0001000 U    1/2008
(Continued)

OTHER PUBLICATIONS

International Search Report for International Application No. PCT/US2018/052983, dated Jan. 11, 2019, 3 pages.
(Continued)

*Primary Examiner* — Tung X Nguyen
(74) *Attorney, Agent, or Firm* — Greenberg Traurig, LLP

(57) ABSTRACT

Embodiments of the invention provide an electric meter assembly including a meter support platform or base able to reversibly electrically couple to a transformer providing inputs including an AC power supply, phase voltage, and/or a phase current. Output of the meter support platform or base can be DC power, AC phase voltage signals and/or AC phase current. Further, a removable or portable meter can couple to the meter support platform or base and to an electric meter
(Continued)

system including a meter core coupled to a wireless transmitter, an antenna, an integrated power sensor, and data meter front end. The system includes a data manager configured for electric service analysis including energy usage, and/or interval temperature, phase voltage, current and phase angle in real time, electric energy kWh and kVARh values in a user-specified period, wrong meter base installation detection, physical location of the removable or portable meter, and tamper detection.

19 Claims, 8 Drawing Sheets

Related U.S. Application Data

(60) Provisional application No. 62/408,390, filed on Oct. 14, 2016.

(51) Int. Cl.
*G01D 4/00* (2006.01)
*G01R 21/00* (2006.01)
*H04L 12/28* (2006.01)

(52) U.S. Cl.
CPC ........ *G01R 22/066* (2013.01); *H04L 12/2816* (2013.01); *Y02B 90/20* (2013.01); *Y04S 20/30* (2013.01)

(56) References Cited

U.S. PATENT DOCUMENTS

| | | | |
|---|---|---|---|
| 8,175,825 | B2 | 5/2012 | Verdun |
| 9,658,254 | B2* | 5/2017 | Ramirez ............. G01R 22/066 |
| 2008/0088464 | A1 | 4/2008 | Gutierrez |
| 2009/0088991 | A1* | 4/2009 | Brzezowski ...... H02J 13/00001 |
| | | | 702/62 |
| 2010/0063755 | A1 | 3/2010 | Verdun |
| 2012/0060606 | A1* | 3/2012 | Lakich .................. G01R 11/24 |
| | | | 73/514.16 |
| 2015/0346250 | A1* | 12/2015 | Liu ........................ G01D 4/002 |
| | | | 702/62 |
| 2018/0332038 | A1* | 11/2018 | Kagan .................. G01R 22/066 |

FOREIGN PATENT DOCUMENTS

| | | |
|---|---|---|
| KR | 20-0439399 Y1 | 4/2008 |
| KR | 10-2012-0071516 A | 7/2012 |
| KR | 10-2014-0003840 U | 1/2014 |
| KR | 10-1649897 B1 | 8/2016 |

OTHER PUBLICATIONS

Written Opinion for International Application No. PCT/US2018/052983, dated Jan. 11, 2019, 7 pages.
International Search Report and Written Opinion for International Application No. PCT/US2017/056790, dated Feb. 2, 2018, 10 pages.

* cited by examiner

SMART ENERGY AND DATA/INFORMATION METERING SYSTEM AND METHOD

RELATED APPLICATIONS

This application is a continuation of U.S. application Ser. No. 15/784,711, filed Oct. 16, 2017, entitled "SMART ENERGY AND DATA/INFORMATION METERING SYSTEM AND METHOD", which claims the benefit of and priority to U.S. Provisional Application No. 62/408,390, filed Oct. 14, 2016, entitled "SMART ENERGY AND DATA/INFORMATION METERING SYSTEM AND METHOD", the entire contents of which are incorporated herein by reference.

BACKGROUND

Some of today's energy metering systems such as residential and commercial electric and gas meters include basic RF communications and remote monitoring functionality. However, these systems typically are not able to provide mobile or broadband metering capability. Moreover, the metering systems are typically hard-wired and coupled to or fixed adjacent to the energy consuming residence or commercial customer's building.

With the accelerating growth of distributed energy systems and mobile transportation and infrastructure, it would be desirable to provide energy metering systems that are capable of roaming energy consumption monitoring and provide real time energy transactions.

SUMMARY

Some embodiments include an electric meter assembly comprising a meter support platform or base configured to reversibly electrically couple to at least one transformer providing inputs comprising an AC power supply, phase voltage, and/or phase current. In some embodiments, the meter support platform or base can be configured to provide outputs of DC power, AC phase voltage signals, and/or AC phase current signals based at least in part on the inputs. Some embodiments include a removable or portable meter configured to couple to the meter support platform or base and to an electric meter system. In some embodiments, the removable or portable meter can comprise a meter core coupled to at least one wireless transmitter, at least one antenna, at least one integrated power sensor, and at least one data meter front end. Some embodiments include a data manager configured for electric service analysis by the electric meter assembly including at least one of energy usage, and/or interval temperature, phase voltage, current and phase angle in real (or substantially real) time, electric energy kWh and kVARh values in a user-specified period, wrong meter base installation detection, physical location of the removable or portable meter, and tamper detection.

Some embodiments include at least one tamper switch. Some further embodiments comprise a LAN/WAN connector. Some embodiments include an antenna that comprises a transmission or receiving capability of least one of a ZigBee, a Bluetooth, a 4G/LTE, WiFi, WiMAX, WiSun, 400 MHz, 900 MHz, and GPS frequencies. Some embodiments comprise at least one accelerometer. Some further embodiments comprise at least one RFID tracking component configured and arranged to be readable by an external RFID reader.

Some embodiments include an electric meter system comprising a removable or portable meter configured to removably couple to a meter support platform or base. In some embodiments the removable or portable meter comprises a meter core coupled to at least one wireless transmitter coupled to least one antenna, at least one integrated power sensor, and at least one data meter front end. Some embodiments include a processor and a non-transitory computer-readable storage medium in data communication with the processor. In some embodiments, the non-transitory computer-readable storage medium includes an electric meter data management process executable by the processor, and configured to manage exchange of electrical data from the at least one removable or portable meter by performing steps executable by the processor. In some embodiments, the steps provide a data manager configured for electric service analysis and wireless transmission of electrical data including energy usage, and/or interval temperature, phase voltage, current and phase angle in real or substantially real time, electric energy kWh and kVARh values in a user-specified period, wrong meter base installation detection, physical location of the removable or portable meter, and tamper detection.

Some embodiments include a meter support platform or base configured to reversibly electrically couple to at least one transformer providing inputs comprising an AC power supply, phase voltage, and phase current, the meter support platform or base configured to provide outputs of DC power, AC phase voltage signals and AC phase current signals based at least in part on the inputs. Some further embodiments comprise at least one antenna comprises a transmission or receiving capability of least one of a ZigBee, a Bluetooth, a 4G/LTE, WiFi, WiMAX, WiSun, 400 MHz, 900 MHz, and GPS frequencies. Other embodiments comprise at least one tamper switch. Some further embodiments comprise a LAN/WAN connector. Some other embodiments include an electric meter data management process executable by the processor is configured to provide web-enabled applications providing customer access to metering services including billing, energy usage and statistics comprising current and past energy usage.

Some embodiments of the invention include a customer mobile application able to enable customer access on a mobile laptop computer and/or mobile phone or smart phone to monitor or view at least one parameter of the energy use by the customer. Some embodiments of the metering services include a graphical presentation of electric phase voltage and current waveforms. In other embodiments, the metering services include access to a display of voltage, current and phase angle values real time. In some further embodiments, the metering services include a store of voltage, current and phase angle values at a user-specified interval. Other embodiments comprise an RFID tracking configured to form a communication channel or link with an RFID reader. Some embodiments comprise a home device control configured to couple to one or more appliances.

In some embodiments, the removable or portable meter is integrated or mounted on a street pole. In other embodiments, the street pole includes at least one service powered by the removable or portable meter, the at least one service including at least one of vehicle telemetry information, remote monitoring of charge/discharge within an electric vehicle route, multi-colored street lights, a cellular module, and/or a Wi-Fi modem, a data meter, a sound detector, a gunshot detector, a camera and/or motion detector, and/or a two-way intercom.

DETAILED DESCRIPTION

Figure 1:
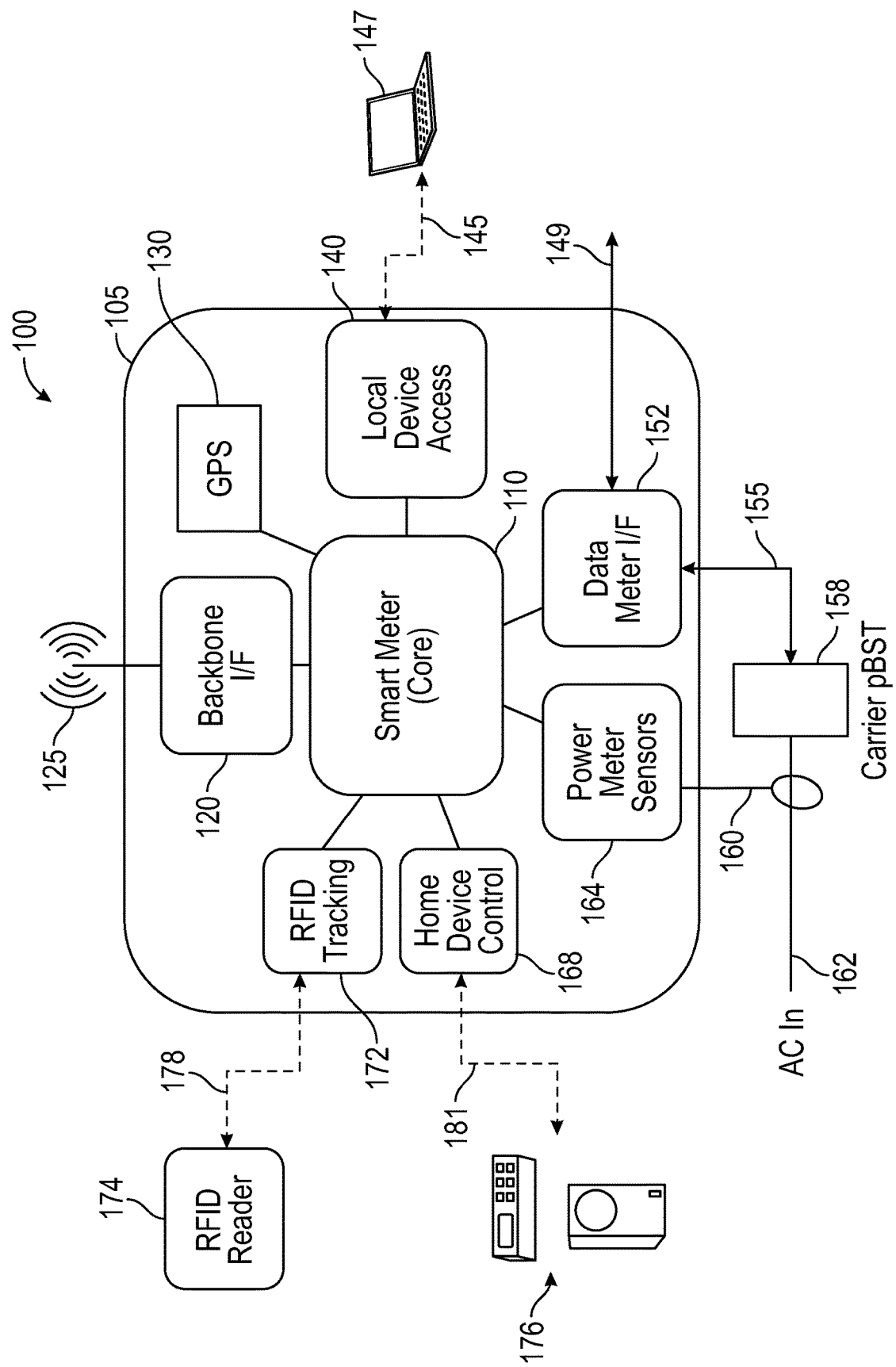
FIG. 1 illustrates a metering system architecture of an electric meter according to embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some embodiments of the invention include one or more interacting components and assemblies that can function as an electric metering system. In some embodiments, the system can function as a fixed, semi-permanent, or mobile energy meter, enabling customers and utilities to monitor and track energy usage and operations of customer appliance/devices/vehicles and utility infrastructure operations (electric, gas, water, data, information, etc.) real-time and by location.

Some embodiments include an electric meter assembly including an electric meter base and mobile meter according to embodiments of the invention. Some embodiments include a panel socket that can be a customer-owned device, where the socket provides a coupling point for at least one electric meter assembly. For example, some embodiments include a meter base that can function as a hub, receptacle, and/or contact point for one or more further components of the electric metering system. In some embodiments of the invention, the meter base can be replaceable, interchangeable and/or upgradeable depending on the energy needs and requirements of the customer or the utility company. In some embodiments, the meter base can contain voltage and/or current sensors. Further, in some embodiments, the meter base can provide DC and/or induction power supply and female connection for other metrology and communication devices such as electric, gas, water, data, etc. In some embodiments, the meter base can include at least one standard connection known in the art, at least one of which can be replaceable. The meter base can include sensing of AC and/or DC values of phase voltage, phase current, and phase angle.

FIG. 1 illustrates a metering system architecture 100 of an electric meter according to some embodiments of the invention. In some embodiments, the system architecture 100 can comprise an electric meter 105 including a meter core 110 coupled to an input/output front end backbone 120. In some embodiments, the metering system architecture 100 can include an electric meter assembly and/or meter base that can be equipped with one or more wireless communication technologies that can be used to receive data or information and/or can be used to transmit data or information (shows as wireless transmission 125). In some embodiments, the electric meter assembly can, include, but not limited to, cellular 4G/LTE, Wi-Fi, WiMAX, Wi-Sun, 400 MHz frequency transceiver capability, 900 MHz frequency transceiver capability, or a combination thereof. Other embodiments can include receivers, transmitters or receivers. For example, some embodiments include a GPS receiver 130.

Some further embodiments of the invention can include at least one RFID module that can provide tracking and asset management capability. Some embodiments of the invention can also include an RF module that can provide sub-metering and communication interconnections between sub-meters and main meters, and interconnectivities with other sub-meters. Moreover, in some embodiments of the invention, the system can provide services such as Internet, home phone, TV, and/or video. For example, some embodiments include RFID tracking 172 that can form a communication channel or link 178 with RFID reader 174.

In some embodiments, any RF module of the metering system architecture 100 can be coupled to a fixed energy meter. For example, in some embodiments, the RF module can be mounted or otherwise coupled or integrated with a fixed energy meter. In some other embodiments, the RF module can be mobile and not mounted or otherwise physically coupled to an energy meter. In some embodiments, the RF module can be removably mounted or coupled to an energy meter. In some embodiments, when the RF module is mounted or coupled to the energy meter, information can be transferred between the energy meter and the RF module. In some further embodiments, a user can move the RF module to within a specific distance from the energy meter to enable transfer of information between the RF module and the energy meter. The specific distance includes distances that are known in the art for RF data transmission distances for known RF standards (described below).

In some embodiments, the RFID module can comprise a variety of module types, including common RF protocols and standards. For example, in some embodiments, the RFID module can include class 1 RFID standard including a simple, passive, read-only backscatter tag with one-time, field-programmable non-volatile memory. Other embodiments can utilize class 2, a passive backscatter tag with up to 65 KB of read-write memory. Other embodiments can use a class 3: a semi-passive backscatter tag, with up to 65 KB read-write memory; essentially, and with a built-in battery. Some further embodiments include Class 4: an active tag with built-in battery, an internal transmitter for transmitting to the reader. Some further embodiments can implement a class 5: an active RFID tag that can communicate with other class 5 tags and/or other devices.

Some embodiments include RFID standards for automatic identification and item management (ISO 18000 series standards). Some embodiments of the invention include an 18000-1 standard that uses generic parameters for air interfaces for globally accepted frequencies. Some embodiments can use an 18000-2 standard with an air interface for 135 KHz. Some further embodiments can use a 18000-3 standard with an air interface for 13.56 MHz. In some further embodiments of the invention, standard 18000-4 can use an air interface for 2.45 GHz. In other embodiments of the invention, standard 18000-5 with an air interface for 5.8 GHz can be used. In some other embodiments, 18000-6 with an air interface for 860 MHz to 930 MHz can be used. In some alternative embodiments, standard 18000-7 with an air interface at 433.92 MHz can be used. Some further embodiments include RF components operating at a 2.4 GHz-ISM frequency band. Some embodiments include one or more integrated communication functions, including, but not limited to, Wi-Fi, Bluetooth®, ZigBee, 4G cellular, RFID, and GPS. Some embodiments include an RF system and method of operation compatible with Bluetooth® and IEEE 802.11x within a mobile device. Bluetooth® is a registered trademark of Bluetooth® SIG Inc. ZigBee is a registered trademark of ZigBee Alliance Corporation.

In some embodiments, the metering system architecture 100 can include a local device access 140 through a link 145. In some embodiments, a user device 147 can access the meter 105 using the local device access 140. Some further embodiments include a carrier data connection 149 coupled to data meter 152. In some embodiments, the data meter 152 through link 155 can couple to "carrier pBST" 158 that is coupled to link 162. Further, some embodiments include power meter sensors 164 coupled to the A/C link 162 with link 162. In some embodiments, the meter 105 can be networked to control one or more devices or appliances. For example, in some embodiments, the meter 105 can include home device control 168. In some embodiments, one or more appliances 176 can be coupled to and/or controlled or monitored with a link 181.

Figure 2:
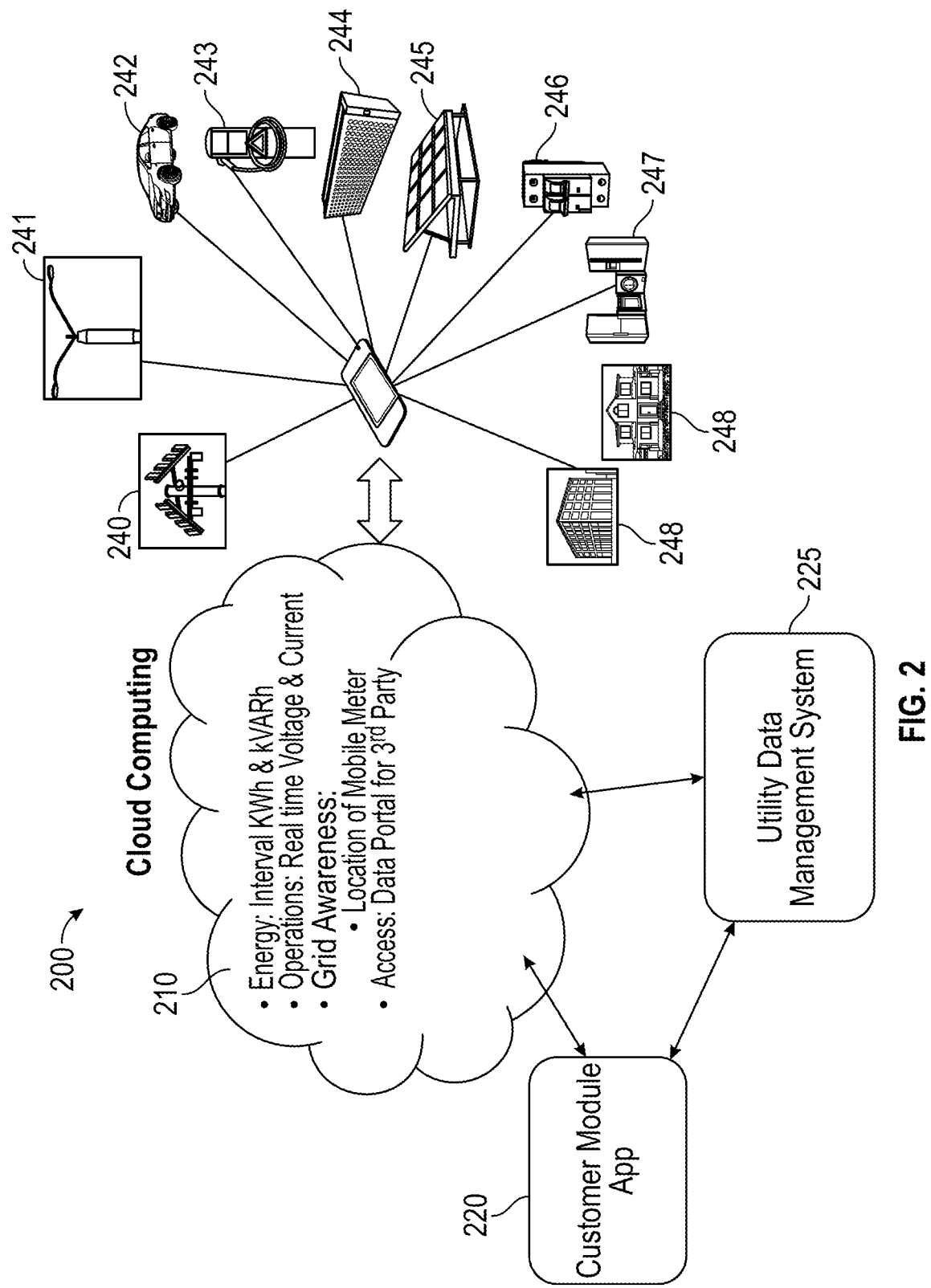
FIG. 2 illustrates a system network including an electric meter in accordance with some embodiments of the invention.

In some embodiments, the metering system architecture 100 can be modular and enable mobility, and be configured for multi-network and cloud-computing. In some embodiments of the invention, one or more components, modules or assemblies of the electric metering system can form part of a cloud-computing network. In some embodiments, cloud-computing (e.g., in the form of one or more cloud computers, one or more cloud servers, and/or one or more cloud storage devices) can be used to store, process, and transmit information to and from at least one component, modules or assembly of the electric metering system. For example, FIG. 2 illustrates a system network 200 including an electric meter 250 in accordance with some embodiments of the invention. In some embodiments, the network 200 can comprise a cloud computing system or server 210 coupled to an electric meter 250.

In some embodiments, the user can access the meter 250 and/or any data from the meter 250 using a customer mobile application 220. In some embodiments, options for customer interface through the use of mobile applications can be accommodated using the cloud-computing system network 200. In some embodiments, the customer can deploy at least one energy meter (e.g., meter 250) at, for example, a fixed location (such as a residential or commercial building or business), and monitor a variety of parameters obtained from the meter 250 at the location or at a remote location using a mobile device. For example, in some embodiments, the customer can use a mobile laptop computer and/or mobile phone or smart phone to monitor at least one parameter of the energy meter. In some further embodiments, personal digital assistants, pagers, digital tablets, or other processor-based devices can be used to access the cloud resource either through a wireless (e.g., a cellular or Wi-Fi signal) or through a wired link coupled to the cloud computing system or server 210.

In some embodiments of the invention, the meter system architecture 100 can be mounted or coupled to multiple applications such as buildings, homes, appliances, circuit breakers, PVs, battery storages, EVs, charging stations, microcell tower/pole, etc. In some embodiments, the system can perform, provide, store, and poll/communicate/transfer routinely, on demand, and ad-hoc the telecommunication bits/bytes metrology in utility cloud-computing and/or in the meter. In some embodiments of the invention, power quality information voltage, current and phase angle values at a user-specified interval, and/or sampling technique on phase voltage and current wave forms can be used by the system to provide a variety of energy metrics. For example, in some embodiments, the system can calculate the energy usage, and/or interval temperature, electric energy kWh and kVARh values in a user-specified period, and/or electric service analyses and information to detect wrong meter base installations, and/or electric service analyses and information to detect tampering and provide potential tampering leads. For example, in some embodiments, through at least one cloud resource (e.g., such as a cloud-based serve and/or computing system), one or more electric meters (e.g., meter 250) can couple to a utility data management system such as utility data management 225 and transmit the variety of parameters mentioned earlier. In this instance, information such as energy use (KWh and KVARh), operation function such as real time (or substantially real time) voltages and current, and grid awareness such as the physical location of a mobile electric meter can be processed through the cloud resource linked with a utility data management (system utility data management 225).

Some embodiments can include provisions for phase voltage, current and phase angle in real (or substantially real) time. In some embodiments, computation of kWh consumption and other power metrics can be done by cloud-computing with various communication back-haul options. This embodiment exemplifies a very different philosophy from the more typical "smart meter" philosophy by performing analyses and computations in the cloud instead of at the meter.

In some embodiments of the invention, one or more components, modules or assemblies of the system network 200 can be integrated with various other systems to provide addition and augmented functions. For example, some embodiments include street poles that can include an electric and data meter. In some embodiments, the system network 200 can include gas meter, multi-color streetlights, electric vehicle induction charging, data and information metering systems, streetlight metering and/or telecom data metering, and vehicle telemetry.

Accordingly, in some embodiments, electrical outages, gas/water leakage, and usage information/data can be monitored and detected real time. In some embodiments, a customer can deploy at least one mobile energy meter (such as with a temporary or seasonal residential or commercial building or business, or with a remote charging station for an electric vehicle, or coupled to other commercial infrastructure), and monitor any of the aforementioned parameters at the location or at a remote location. For example, in some embodiments, the meter 250 can be associated with or be coupled to a microcell tower or pole 240. In some embodiments, the electric metering system can function as a telecommunication conduit for other services such as internet, video, TV, advertisements, etc. Moreover, in some embodiments, using customer identification information, the electric metering system can function as a telecommunication conduit for services (i.e. internet, video, TV, advertisements, etc.) that are tailored or targeted to the customer's needs, preferences, or geographic location. In some embodiments, the system can generate licensing fees for revenues that can help lower the customer's energy rate. Further, in some embodiments, the system can enable customers to be informed about commercial services, public safety (i.e. shopping, police, fire, hospital, etc.), and can be used to improve public and personal safety (i.e. in emergency situations, such as accidents, stranded vehicle, etc.). Some embodiments can also include electrical outage and gas/water leakage monitoring and/or call notifications and identifications. Further, some embodiments can function as or couple to telecommunications hubs that can provide improved bandwidth for field personnel communications and provide mobile telemetry. In some embodiments, the system can provide local, area-wide, and/or global Internet services.

In some further embodiments, the meter 250 can be associated with or coupled to a partial electric vehicle 242, and/or an electric charger 243, and/or battery storage 244, and/or a photovoltaic system 245, and/or a circuit breaker 246, and/or appliances 247, and/or infrastructure 248. In the latter example embodiments, a mobile energy meter and remote application can be used to guide customers when and where to plug in either to charge or discharge, and potentially lower operating/maintenance cost of an electric vehicle (EV). This can enable customers and utilities to better manage EV loads (when charging) and generations (when discharging), and help lower costs of the grid construction, maintenance and operation. Thus, in some embodiments, EVs with embodiments of the mobile meters described herein can support and benefit the electrical grid system, and customers can be provided with real time charging/discharging cost and kWh quantity. Further, in some embodiments, the electric metering system can function to provide vehicle telemetry and/or form part of a self-driving infrastructure. In some embodiments, using a combination of smart poles and/or micro cell sites, the electric metering system relay vehicle telemetry information, and provide remote monitoring of charge/discharge within an electric vehicle route. Furthermore, because the cloud-based system can be managed and/or coupled to at least one utility data management system (system 225), the system can be used to guide customers when and where to plug in either to charge or discharge based on location, charging station status, local and area-wide grid loads, etc., providing real time location based charge/discharge updates, operating with real time data on the grid.

In some embodiments, when coupled to a cloud system, billing information can be processed and billing data transferred to the utility MDM, and can be utilized across a wide variety of application including fixed premises, circuit breakers, appliances, EVs, PVs, electric charging stations, battery storage, microcell tower/Pole, etc., capable of monitoring phase voltage, current and angle real time. In some embodiments, the system can provide hotspot services (Internet, home/car/cell phone, TV, Video, etc.). In some embodiments, one or more modules of the system network 200 can provide one or more web-enabled applications providing customer access to various metering services, including, but not limited to billing, energy (and/or gas, water, data, information, etc.) usage and statistics, current energy (and/or gas, water, data, information, etc.) use and system/device status. In some embodiments, one or more components, modules or assemblies of system network 200 can use the cloud computing system or server 210 to provide remote photographic and/or video monitoring. In other embodiments of the invention, one or more components, modules or assemblies of system network 200 can use the cloud computing system or server 210 to provide gunshot detection. In some further embodiments, one or more components, modules or assemblies of system network 200 can use the cloud computing system or server 210 to monitor, meter, and/or control color-coded lights for safety on pedestrian, streets and/or traffic areas. In some other embodiments, the meter 250 can provide real time voltage, leak detection and pressure information (e.g., for gas and water utility systems), streetlights with dimming ability, emergency flash functions, etc.

In some embodiments, some street poles can include an electric and data meter (represented by integrated smart pole 241) and can include multi-colored street lights for improved visual safety indications to the general public, to first aid responders, and to law enforcement when responding to any emergency situations. Further, in some embodiments, the street light can use the multi-color streetlight function for festive or holiday light decors and displays. In some embodiments, the integrated smart pole 241 can use the multi-color streetlight function for festive or holiday light decors and displays including, but not limited to, white, and/or red, and/or amber, and/or blue, and/or green flashing turned on during a holiday season and/or a public event such as a parade. Further, for example, some embodiments include an integrated smart pole multi-colored street light comprising a multi-color enabled street light housing coupled to and/or integrated with a smart pole. In some embodiments, the multi-color enabled street light housing can include a plurality of different light sources capable of emitting a plurality of colors or light wavelengths. For example, some embodiments include a plurality of LED light sources. In some further embodiments, the LED light sources can include multi-color (e.g., white, red, amber, blue and/or green) light emission. Some embodiments of the invention include a plurality of LED light sources where the LED light sources each emit a different color than each other (i.e., no LED light source emits a color that is the same as another LED light source in the housing). In some further embodiments, the plurality of LED light sources can include duplicated colors where the housing includes two or more LED light sources that emit substantially the same colored light. In some embodiments, the plurality of light sources can be positioned in a specific arrangement in the housing.

For example, in some embodiments, LED light sources can be evenly distributed or positioned in the housing. In other embodiments, the LED light sources can be unevenly distributed or positioned in the housing. For example, some embodiments include groups or clusters of LED light sources. In some embodiments, the groups or clusters can comprise LED light sources with the same color. In some other embodiments, at least one of the groups or clusters can comprises LED light sources with at least two different colored LED light sources. In some other embodiments, any one of the LED light sources can comprise a multi-color emission capable LED light source. For example, some embodiments include at least one LED light source that can be controlled or switched from one color emission to at least one other color emission.

In some embodiments, the integrated smart pole 241 can be programmed for safety and/or security applications. In some embodiments of the invention, the integrated smart pole 241 can comprise a multi-color enabled street light housing with one or more flashing light sources. Further, in some embodiments, the multi-color enabled street light housing can include one or more light sources capable of creating an animation. In some embodiments, one or more LED light sources can be pulsed, flashed, and/or animated. For example, some embodiments include red LEDs that can be flashed or pulsed when there is an medical emergency or dangerous situation requiring immediate attention. Some further embodiments can include amber LEDs that can flash or pulsate when there is a caution condition requiring attention and/or speed reduction (i.e., warning of road construction, an accident, foggy weather, an amber alert, etc.) Some other embodiments of the invention include one or more blue light emitting LEDs that can be configured to flash or pulsate when there is a non-emergency situation requiring attention or escort.

In some further embodiments, the integrated smart pole 241 can be integrated or coupled with various system components including, but not limited to, one or more energy meters, a control relay for controlling a meter, one or more communication systems such as a cellular module, and/or a Wi-Fi modem, a data meter, a sound detector, a camera and/or motion detector, and/or a two-way intercom. In some embodiments, the integrated smart pole 241 including any of the components or systems described above can be integrated with a monitoring and control system. In some embodiments, any conventional advanced metering infrastructure (AMI) or automated meter reading (AMR) systems (e.g., such as MV-90, which is a product sold by Itron/UTS), and/or any wireless mean network and meter (NGM) can be used to monitor and control one or more smart poles 241. For example, in some embodiments, by coupling to an AMI network, users can access and/or monitor any integrated smart pole 241. In some embodiments, access, monitoring, and/or control can be accomplished through at least one operational system including, for example, an AMI operating system, data analytics, and associated street light control software. In some embodiments, other communication systems and protocols can be used including, but not limited to 4G/LTW, WiSun, and 400 MHz and 900 MHZ RF. In some embodiments, one or more integrated smart poles 241 can couple into a system such as the monitor and control system to provide billing calculations and processing for one or more utility companies, and can process and distribute one or more utility bills to one or more utility customers.

Figure 3:
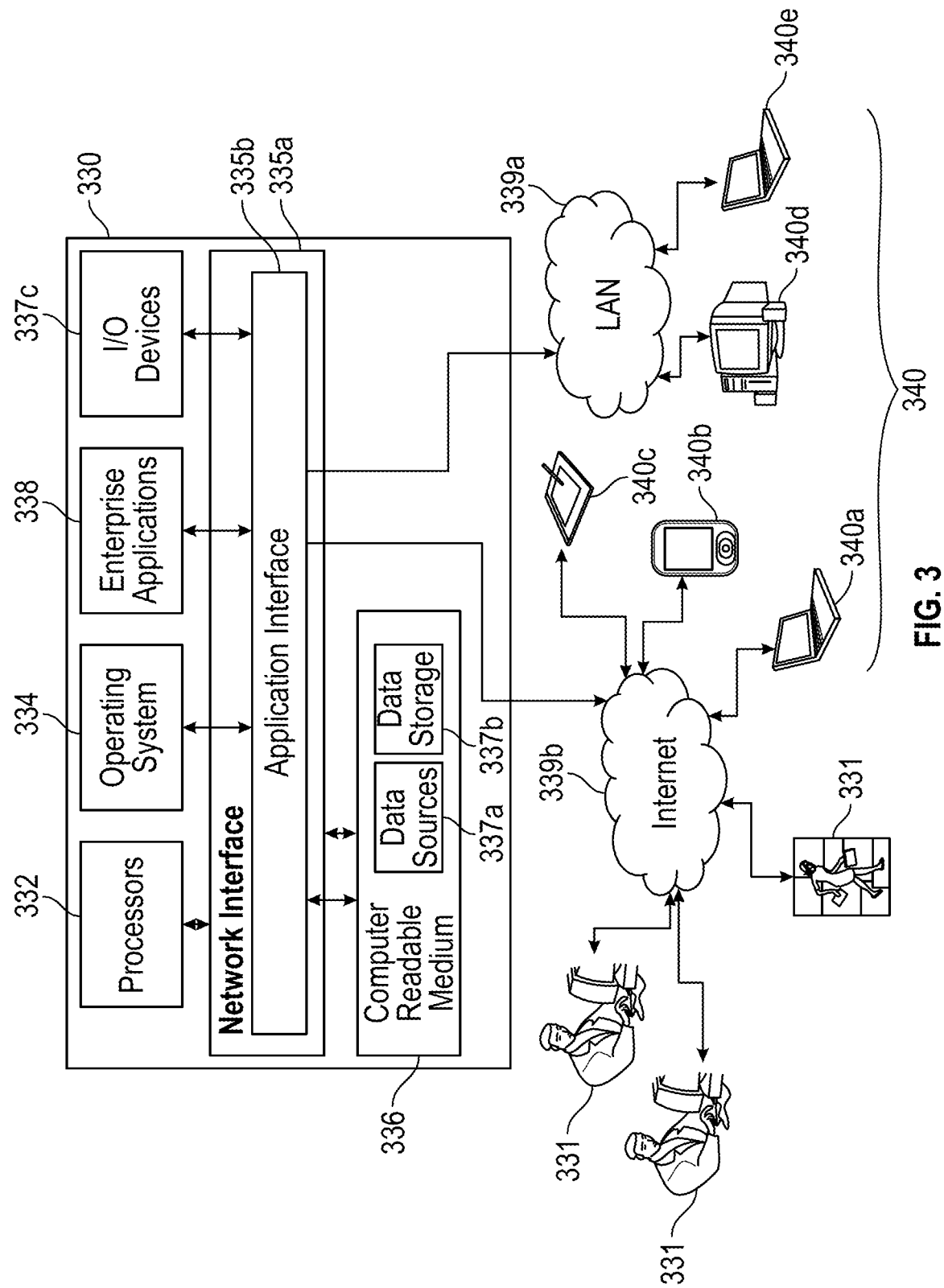
FIG. 3 illustrates a computing system for operating the communication and data transfer protocols of the energy metering system and method in accordance with some embodiments of the invention.

In some embodiments of the invention, the electric metering system can comprise or use at least one computing system within the cloud-computing network. For example, FIG. 3 illustrates a computing system suitable for managing and operating the processing, communication, and data transfer protocols of the energy metering system and method in accordance with some embodiments of the invention. In some embodiments, the computer system 330 can include at least one computing device, including one or more processors 332. Some processors 332 can include processors residing in one or more conventional server platforms. In some embodiments, the computer system 330 can include a network interface 335a and an application interface 335b coupled to at least one processors 332 capable of running at least one operating system 334 and/or one or more of the software modules (e.g., enterprise applications 338). In some embodiments, the software modules 338 can include server-based software platform that can include energy metering system and method software modules suitable for hosting at least one user account and/or at least one client account, as well as being capable of transferring data between one or more accounts.

Some embodiments of the invention relate to a device or an apparatus for performing these operations. In some embodiments, the apparatus can be specially constructed for the required purpose, such as a special purpose computer. When defined as a special purpose computer, the computer can also perform other processing, program execution or routines that are not part of the special purpose, while still being capable of operating for the special purpose. Alternatively, in some further embodiments, the operations can be processed by a general purpose computer selectively activated or configured by one or more computer programs stored in the computer memory, cache, or obtained over a network. In some embodiments, when data are obtained over a network the data can be processed by other computers on the network, e.g. a cloud of computing resources (e.g., such as cloud computing system or server 210).

With the above embodiments in mind, it should be understood that the invention can employ various computer-implemented operations involving energy and data/information metering system and method data stored in computer systems. Moreover, the above-described databases and models throughout the energy metering system and method can store analytical models and other data on computer-readable storage media within the computer system 330 and on computer-readable storage media coupled to the computer system 330. In addition, the above-described applications of the energy metering system and method can be stored on computer-readable storage media within the computer system 330 and on computer-readable storage media coupled to the computer system 330. These operations are those requiring physical manipulation of physical quantities. Usually, though not necessarily, these quantities take the form of electrical, electromagnetic, or magnetic signals, optical or magneto-optical form capable of being stored, transferred, combined, compared and otherwise manipulated.

In some embodiments, the computer system 330 comprises at least one computer readable medium 336 coupled to at least one data storage device 337b, and/or at least one data source 337a, and/or at least one input/output device 337c. In some embodiments, the invention embodied by the energy metering system and method can be implemented as computer readable code on a computer readable medium 336. The computer readable medium 336 can be any data storage device that can store data, which can thereafter be read by a computer system (such as the computer system 330). Examples of the computer readable medium 336 can include hard drives, network attached storage (NAS), read-only memory, random-access memory, FLASH based memory, CD-ROMs, CD-Rs, CD-RWs, DVDs, magnetic tapes, other optical and non-optical data storage devices, or any other physical or material medium which can be used to tangibly store the desired information or data or instructions and which can be accessed by a computer or processor (including processors 332).

In some embodiments of the invention, the computer readable medium 336 can also be distributed over a conventional computer network via the network interface 335*a* so that the energy metering system and method embodied by the computer readable code can be stored and executed in a distributed fashion. For example, in some embodiments, one or more components of the computer system 330 can be tethered to send and/or receive data through a local area network ("LAN") 339*a*. In some further embodiments, one or more components of the computer system 330 can be tethered to send or receive data through an internet 339*b* (e.g., a wireless internet). In some embodiments, at least one software application 338 running on one or more processors 332 can be configured to be coupled for communication over a network 339*a*, 339*b*. In some embodiments, one or more components of the network 339*a*, 339*b* can include one or more resources for data storage, including any other form of computer readable media beyond the media 336 for storing information and including any form of computer readable media for communicating information from one electronic device to another electronic device.

In some embodiments, the network 339*a*, 339*b* can include wide area networks ("WAN"), direct connections (e.g., through a universal serial bus port) or other forms of computer-readable media 336, or any combination thereof. Further, in some embodiments, one or more components of the network 339*a*, 339*b* can include a number of client devices (e.g., such as user device 147) that can be personal computers 340 including for example desktop computers 340*d*, laptop computers 340*a*, 340*e*, digital assistants and/or personal digital assistants (shown as 340*c*), cellular phones or mobile phones or smart phones (shown as 340*b*), pagers, digital tablets, internet appliances, and other processor-based devices. In general, a client device can be any type of external or internal devices such as a mouse, a CD-ROM, DVD, a keyboard, a display, or other input or output devices 337*c*. In some embodiments, various other forms of computer-readable media 336 can transmit or carry instructions to a computer 340, including a router, private or public network, or other transmission device or channel, both wired and wireless. The software modules 338 can be configured to send and receive data from a database (e.g., from a computer readable medium 336 including data sources 337*a* and data storage 337*b* that can comprise a database), and data can be received by the software modules 338 from at least one other source. In some embodiments, at least one of the software modules 338 can be configured within the system to output data to a user 331 via at least one digital display (e.g., to a computer 340 comprising a digital display).

In some embodiments, the computer system 330 as described can enable one or more users 331 to receive, analyze, input, modify, create, and/or send data to and from the computer system 330, including to and from one or more enterprise applications 338 running on the computer system 330. Some embodiments include at least one user 331 coupled to a computer 340 accessing one or more modules of the energy metering system and method including at least one enterprise applications 338 via a stationary I/O device 337*c* through a LAN 339*a*. In some other embodiments, the computer system 330 can enable at least one user 331 (through computer 340) accessing enterprise applications 338 via a stationary or mobile I/O device 337*c* through an internet 339*a*.

In some embodiments, the meter 250 can be assembled into a compact housing suitable for installation into or with any of the devices, components, systems, or structures described earlier. In some embodiments of the invention, the electric meter 250 can incorporate various semiconductor technologies that enable mobility metering and broadband metering within an integrated device with reduced size compared with conventional metering systems. For example, some embodiments utilize various system-on-chip technologies that can integrate a variety functions that would normally reside in separate modules and/or coupled devices. In some embodiments, the system-on-chip systems can incorporate an operating system, and a host interface along with data collection and error control processing. Further, the system-on-chip can integrate mobility and communications modules, with seamless integration with the operating system, data collection, and host interface.

In some embodiments, the meter system architecture 100 can include at least one sensor and power supply. In some embodiments, the system can include, but not be limited to, a socket based—ANSI (CL 200, CL20), a disconnect switch, and a communication module with display and switchable multi-communication technologies (4G/LTE, Wi-Fi, WiMAX, Wi-Sun, 400 MHz & 900 MHz RF, etc.). In some embodiments, standard male/female pins can be used to make connection to the meter, and can comprise neutral, phase a+b+c voltage ac signals, phase a+b+c current ac signals, as well as +/−dc power supply connections to electric, gas, water, data/information meters/metering systems. Further, in some embodiments, the energy meter can include an internal-meter temperature monitoring system. In some embodiments, the voltage and current sensors of the invention can include potential and current transformers and/or Hall Effect technology. In some embodiments, the system can implement a 200 Amp disconnect switch for residential systems, and an AC/DC power supply for utility block. Standard male/female pins can be used to make connection to the block: Neutral, Phase A+B+C voltage AC signals, Phase A+B+C current AC signals, AC or +/−DC Power Supply.

In some embodiments, the meter system architecture 100 can include communication that can switch between technologies or not switch (are fixed). Some embodiments include communication that can utilize and/or provide any one of telecommunication technologies as designated or programmed. In some embodiments, communications can be bidirectional between the meter and the cloud platform, and live monitoring/display can occur in the office. In some embodiments, communications frequency is user-specified in milliseconds, shorter, or longer, on demand, ad-hoc, etc.

Some embodiments of the invention include a user-specified interval for communication of information to/from the system. For example, some embodiments include a user enable to specify a time interval at the data transmission interval (microseconds, milliseconds, etc.) of one second, or several seconds, or 1 minute, or 5 minutes, or 15 minutes, or 60 minutes.

In some embodiments, the system architecture 100 and/or network 200 can assemble data for a graphical presentation of electric phase voltage and current waveforms, and provide access to display of voltage, current and phase angle values real time. Further, some embodiments can provide and store voltage, current and phase angle values at a user-specified interval, and transfer the interval data to other utility applications coupled to the network (e.g., the cloud network). Some embodiments provide a user with the capability to provide and store power quality information voltage, current and phase angle values at a user-specified interval. Moreover, in some embodiments, the system architecture 100 and/or network 200 can perform sampling techniques on phase voltage and current wave forms to calculate the energy usage.

In some embodiments of the invention, the system architecture 100 and/or network 200 can include one or more integrated sensors, including, but not limited to, at least one accelerometer or other conventional movement sensor. For example, in some embodiments, the sensors can comprise one or more integrated seismic sensors that can be configured to enable the electric meter to monitor seismic activity. In some embodiments, the seismic components can be integrated as an ASIC and/or as part of a circuit board of the electric meter (e.g., such as meter 250). In some embodiments, the seismic monitoring can utilize three channels (xyz) of acceleration sampled at about 50 samples per second per channel. In other embodiments, the sample rate can be higher or lower than 50 samples per second per channel. In some embodiments, the minimum digital resolution can be 14 bits. In some embodiments, there can be anti-alias filtering with about a 10-15 Hz corner frequency. In some embodiments, the sensing can be accomplished by either analog or digital accelerometers. As one non-limiting example, the digital accelerometer can be an NXP FXLS8471Q, using an I2C interface. Other conventional digital or analog accelerometers can be used. In some embodiments of the invention, the data flow can be continuous into a FIFO or ring buffer. In some embodiments, a processor or DSP-based trigger algorithm can decide when to record an earthquake packet with a fixed length (e.g., about 90 seconds). Other package lengths can be used. In some embodiments, the electric meter orientation is not critical. Some embodiment can use an arbitrary horizontal orientation of the X and Y axes with Z-axis as vertical.

Figure 4:
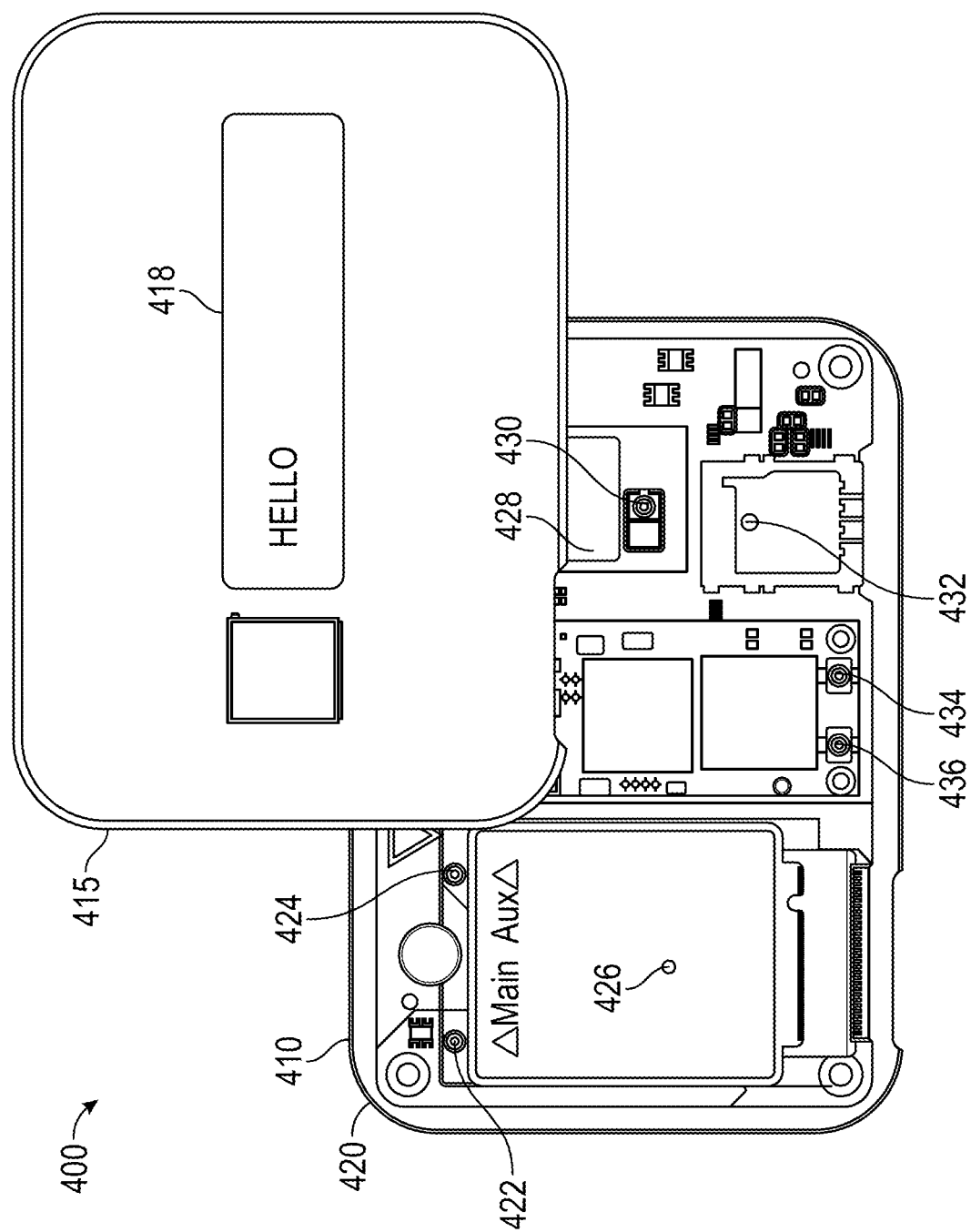
FIG. 4 illustrates an assembly view of an electric meter in accordance with some embodiments of the invention.
Figure 5:
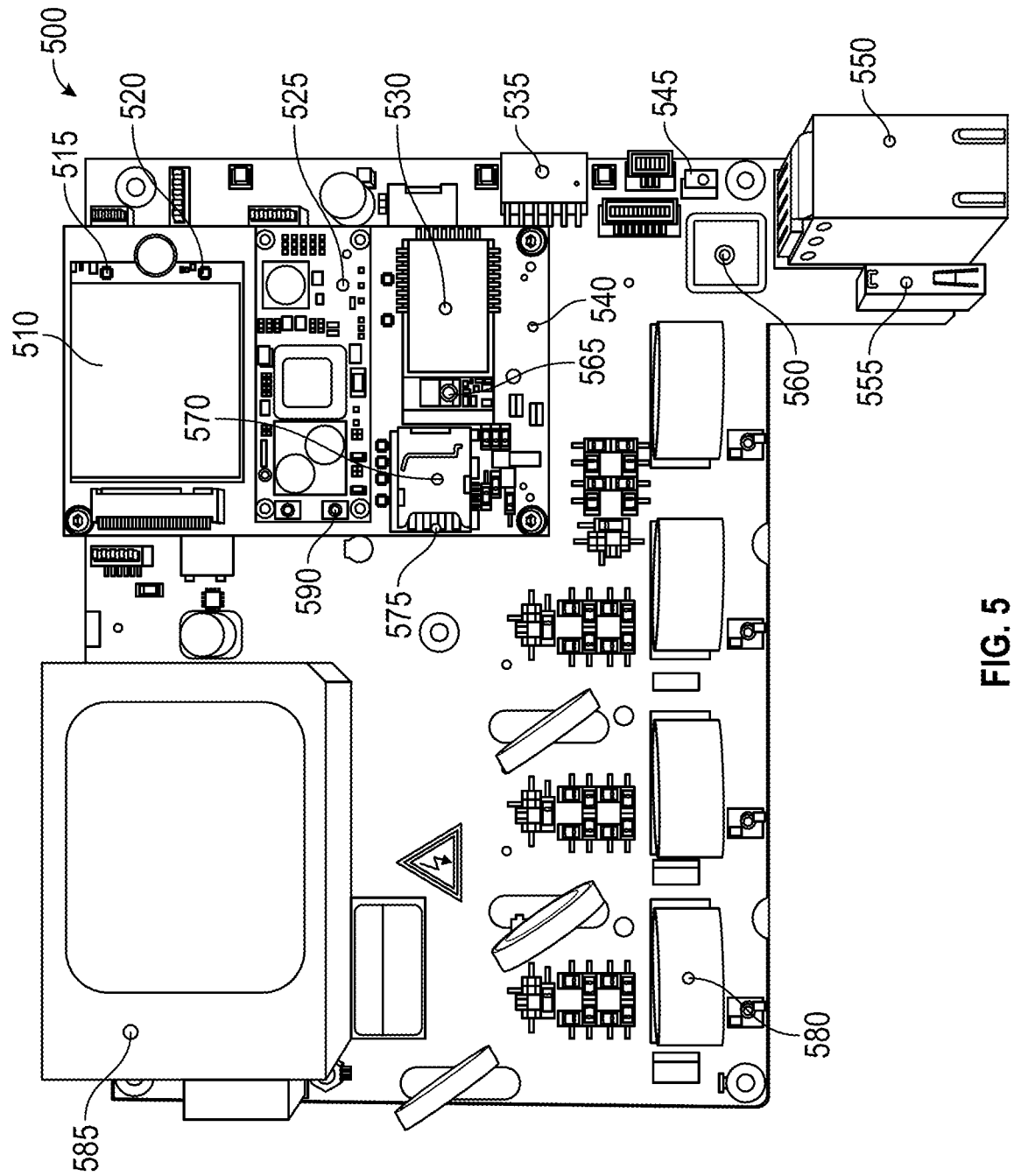
FIG. 5 illustrates a board assembly of an electric meter accordance with some embodiments of the invention.
Figure 6:
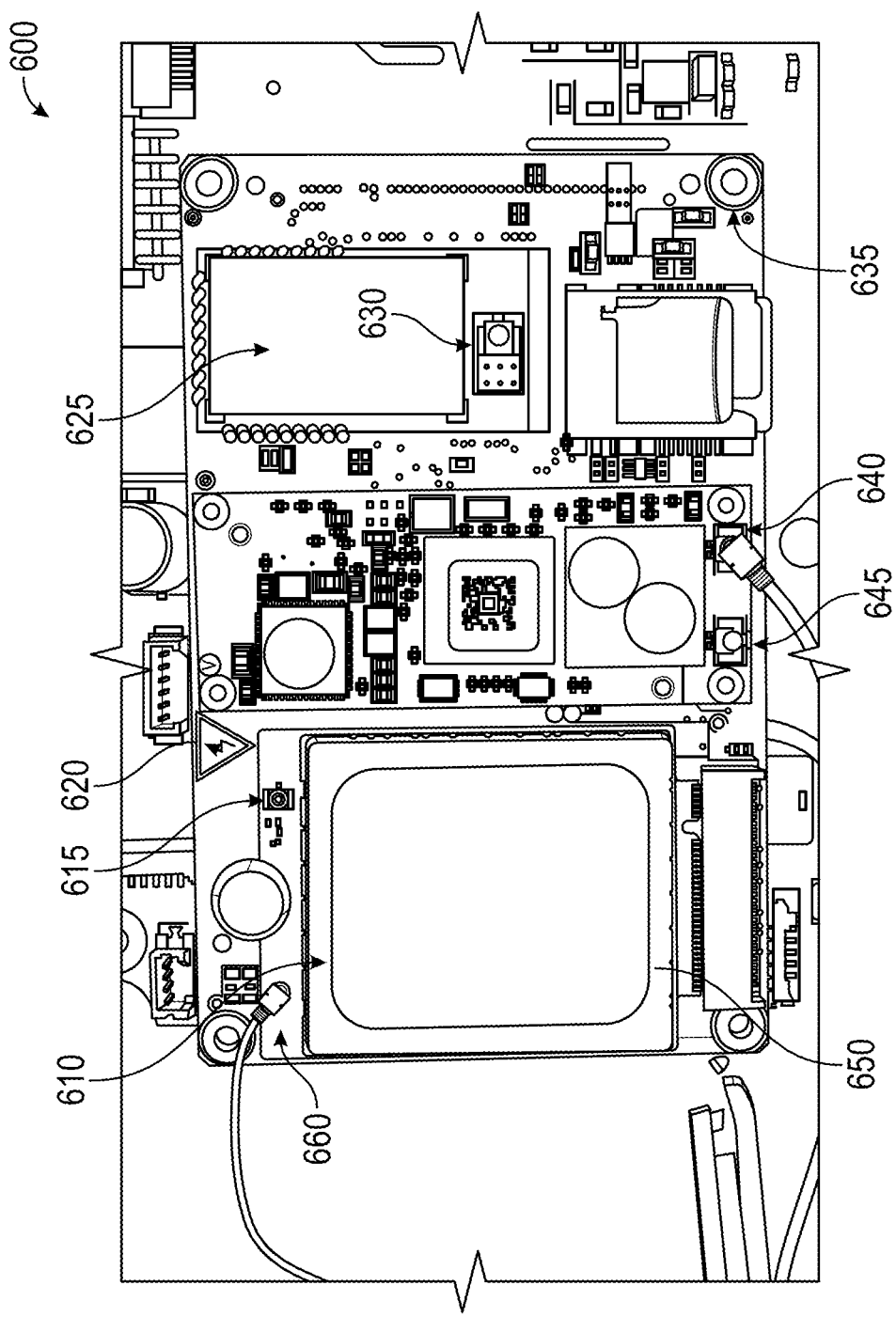
FIG. 6 illustrates a board assembly of an electric meter accordance with some embodiments of the invention.

In some embodiments, components or assemblies of the system architecture 100 and/or network 200 can comprise one or more components, boards and/or assemblies of FIGS. 4-6. For example, in one non-limiting example embodiment, FIG. 4 illustrates an assembly view of an electric meter 400 in accordance with some embodiments of the invention. In some embodiments, the meter 250 can comprise the electric meter 400. In some embodiments, the electric meter 400 can include a base housing 410 that can be coupled to an upper housing 415. In some embodiments, the upper housing 415 can include a display 418. In some embodiments, the electric meter 400 can include board assembly 420 (shown mounted into base housing 410). In some embodiments, the board assembly 420 can include a plurality of integrated and/or mounted components, including, but not limited to, controllers, processors, receivers, transmitters, antenna, and memory. For example, in some embodiments, the board assembly 420 of the electric meter 400 can include a cellular antenna 422 (e.g., such as a 4G/LTE antenna), and/or a GPS antenna 424, and/or modem/receiver 426 (e.g., such as a 4G/LTE modem GPS receiver), and/or computing module 428, and/or antenna 430 (e.g., such as a ZigBee® antenna), and/or an SD card 432, and/or antenna 434 (e.g., such as a Bluetooth® antenna), and/or antenna 436 (e.g., such as a WiFi antenna). Some embodiments can include a two-way inverter safety switch for inverter application for charge/discharge. In some embodiments, the RF module, the RFID module and/or the meter component of the system can include one or more security protocols. For example, some embodiments include advanced encryption standard (AES). Some embodiments can include performance of cryptographic challenge and response protocols, including dynamic challenge-response protocols.

Some further embodiments can include meter 250 are shown in FIGS. 5 and 6. For example, FIG. 5 illustrates a board assembly 500 of an electric meter in accordance with some embodiments of the invention. In some embodiments, the board assembly 500 can include a plurality of integrated and/or mounted components, including, but not limited to, controllers, processors, receivers, transmitters, antenna, and memory. For example, in some embodiments, the assembly 500 can include, but not be limited to, a transceiver 510, antenna port 515, antenna port 520, system on mobile 525, a cellular transceiver 530, an SSN connection 535, a core board 540, a tamper switch 545, a connector 550 (e.g., such as a LAN/WAN connector), a connector 555 (e.g., such as a USB connector), an accelerometer 560, an antenna port 565 (e.g., such as a ZigBee®), an SD socket 570, a SIM socket 575, CT's 580, and a power supply 585.

Further, FIG. 6 illustrates a board assembly 600 of an electric meter in accordance with some embodiments of the invention. In some embodiments, the electric meter 250 can comprise the board assembly 600. In some embodiments, the board assembly 600 can include a plurality of integrated and/or mounted components, including, but not limited to, controllers, processors, receivers, transmitters, antenna, and memory. In some embodiments, the assembly 600 can include, but not be limited to, a receiver 610 (e.g., such as a GPS receiver), an antenna 615 (e.g., such as a GPS antenna), a meter component 620, a radio transceiver 625 (e.g., such as a ZigBee® radio transceiver), an antenna 630 (e.g., such as a ZigBee® antenna), an accelerometer 635, an antenna 640 (e.g., such as a Bluetooth® antenna), and antenna 645 (e.g., such as a Wi-Fi antenna), a modem 650 (e.g., such as a 4G/LTE modem), and an antenna 660 (e.g., such as a 4G/LTE antenna).

Figure 7A:
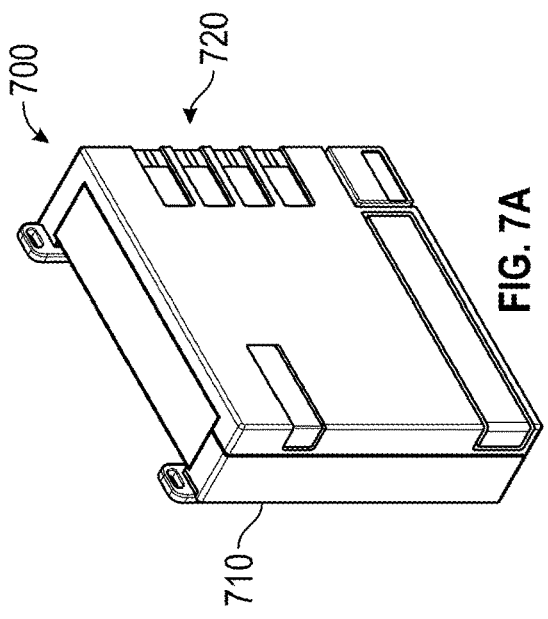
FIGS. 7A-C illustrates views of an electric meter module in accordance with some embodiments of the invention.
Figure 7C:
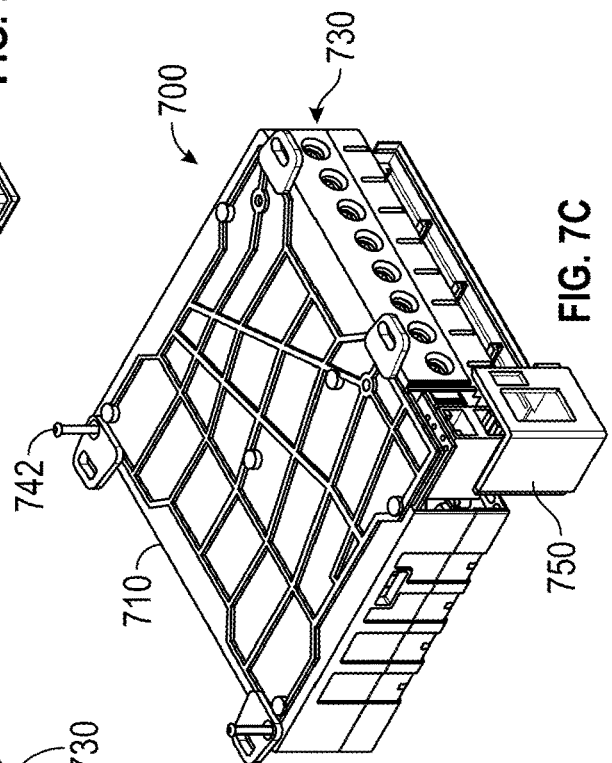
Figure 7B:
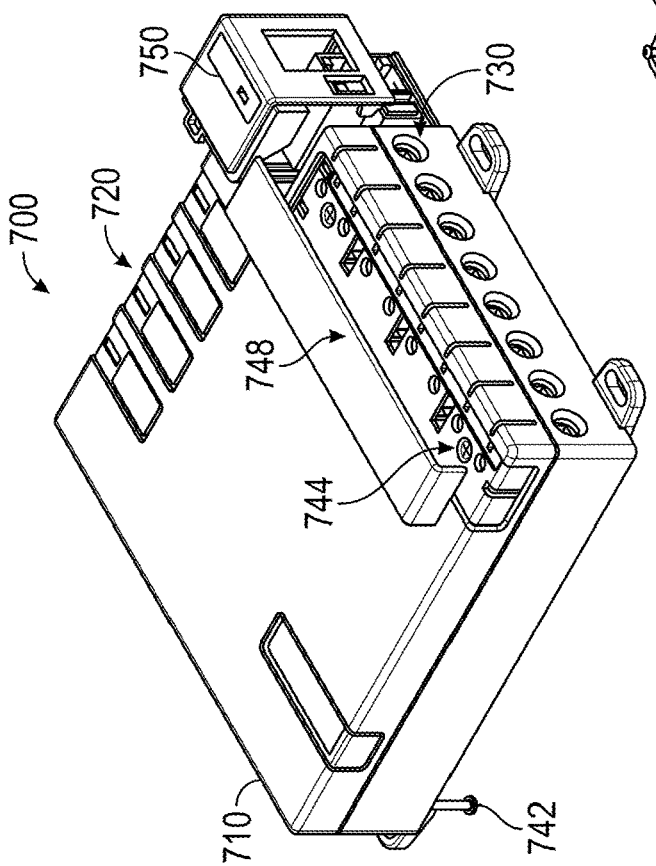
Figure 8A:
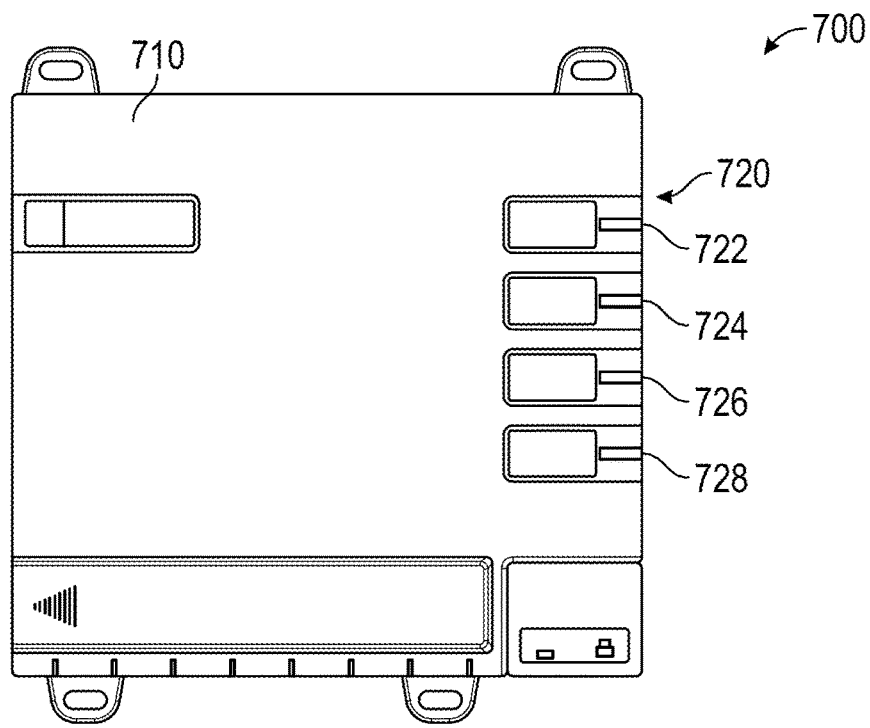
FIGS. 8A-C illustrates views of an electric meter module in accordance with some embodiments of the invention.
Figure 8B:
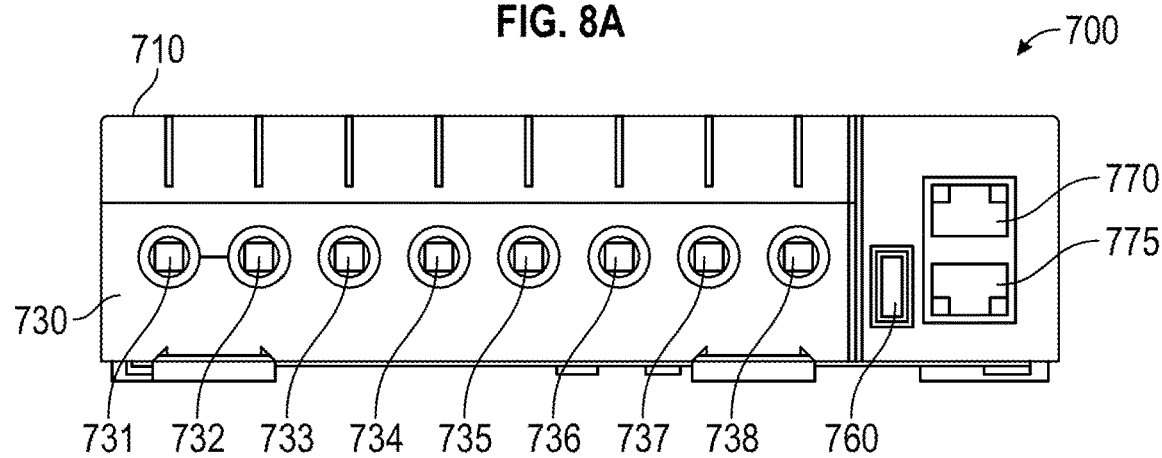
Figure 8C:
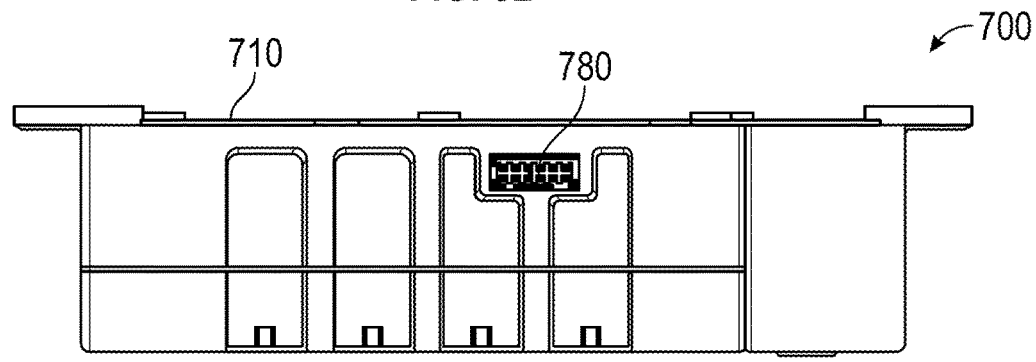

In some embodiments, the electric meters of the system architecture 100 and/or network 200 can be assembled into a compact housing. For example, FIGS. 7A-C illustrate views of an electric meter module 700 in accordance with some embodiments of the invention, and FIGS. 8A-C illustrates views of an electric meter module 700 in accordance with some embodiments of the invention. In some embodiments, the meter module 700 can comprise housing 710 that can provide a mechanically and environmentally robust structure including various terminals, tabs, and/or connectors to enable the electric meter module 700 to connect to AC power and to couple to external data input/output leads or other connectors. Other embodiments include one or more indicators that can provide information related to one or more functions of the electric meter module 700. For example, some embodiments include indicators 720 distributed on one side of the housing 710. In some embodiments, the indicators can comprise a power indicator 722. In other embodiments, the indicators 720 can include a status or operation of an RF transmission or receiving activity including, but not limited to, an LTE indicator 724, a Bluetooth® indicator 726, and a GPS indicator 728. Further, some embodiments include a plurality of edge connectors 730 including power connectors, including, but not limited to "Ai" connector 731, and/or "Ao" connector 732, and/or "Bi" connector 733, and/or "Bo" connector 734, and/or "Ci" connector 735, and/or "Co" connector 736, and/or "Ni" connector 737, and/or "No" connector 738. In some embodiments, the housing 710 can be assembled and coupled using one or more fixing screws 742, 744. In some embodiments, a terminal block cover 748 can be positioned on the housing to cover or enclose one or more of the edge connectors 730. Some further embodiments include a communication port panel 750 positioned on one side or corner of the housing 710. In some embodiments, the communication port panel 750 can include miscellaneous communication ports, including, but not limited to, USB port 760, LAN port 770, and WAN port 775. Other embodiments include an SSN port 780 extending through one side of the housing 710.

The embodiments of the present invention can also be defined as a machine that transforms data from one state to another state. The data can represent an article, that can be represented as an electronic signal and electronically manipulate data. The transformed data can, in some cases, be visually depicted on a display, representing the physical object that results from the transformation of data. The transformed data can be saved to storage, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine. Computer-readable storage media, as used herein, refers to physical or tangible storage (as opposed to signals) and includes without limitation volatile and non-volatile, removable and non-removable storage media implemented in any method or technology for the tangible storage of information such as computer-readable instructions, data structures, program modules or other data.

Although method operations can be described in a specific order, it should be understood that other housekeeping operations can be performed in between operations, or operations can be adjusted so that they occur at slightly different times, or can be distributed in a system which allows the occurrence of the processing operations at various intervals associated with the processing, as long as the processing of the overlay operations are performed in the desired way.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the description and claims herein.

The invention claimed is:

1. An electric meter assembly comprising:
   a removable or portable meter, and
   a meter support platform or base;
   wherein the meter support platform or base is configured to removably electrically couple to at least one transformer;
   wherein the removable or portable meter is configured to removably electrically couple to the meter support platform or base;
   wherein the meter support platform or base is configured to receive inputs comprising at least one of an AC power supply, a phase voltage, and a phase current from the at least one transformer; and
   wherein the meter support platform or base is configured to provide outputs of at least one of DC power, AC phase voltage signals, and AC phase current signals to the removable or portable meter based at least in part on at least one of the inputs.

2. The electric meter assembly of claim 1, further comprising at least one tamper switch.

3. The electric meter assembly of claim 1, further comprising a LAN/WAN connector.

4. The electric meter assembly of claim 1, further comprising at least one antenna comprising a transmission or receiving capability of least one of a ZigBee®, a Bluetooth®, a 4G/LTE, Wi-Fi, WiMAX, Wi-Sun, 400 MHz, 900 MHz, and a GPS frequency.

5. The electric meter assembly of claim 1, further comprising at least one accelerometer.

6. The electric meter assembly of claim 1, further comprising at least one RFID tracking component configured and arranged to be readable by an external RFID reader.

7. An electric meter system comprising:
   a removable or portable meter, and
   a meter support platform or base;
   wherein the meter support platform or base is configured to removably electrically couple to at least one transformer;
   wherein the removable or portable meter is configured to removably couple to the meter support platform or base; and
   wherein the meter support platform or base is configured to receive inputs comprising at least one of an AC power supply, a phase voltage, and a phase current from the at least one transformer;
   wherein the meter support platform or base is configured to provide outputs of at least one of DC power, AC phase voltage signals, and AC phase current signals; and
   wherein the removable or portable meter: comprises a data manager configured for electric service analysis and transmission of electrical data including at least one of energy usage, interval internal temperature, voltage, current, phase angle, electric energy kWh and kVARh values, wrong installation detection, physical location of the removable or portable meter, and tamper detection.

8. The electric meter system of claim 7, further comprising at least one transmitter comprising a wireless transmitter; and
   further comprising an antenna which comprises a transmission or receiving capability of least one of a ZigBee®, a Bluetooth®, a 4G/LTE, WiFi, WiMAX, WiSun, 400 MHz, 900 MHz, and a GPS frequency.

9. The electric meter system of claim 7, further comprising at least one tamper switch.

10. The electric meter system of claim 7, further comprising a LAN/WAN connector.

11. The electric meter system of claim 7, further comprising an electric meter data management process stored on a non-transitory computer-readable storage medium that when executed by a processor is configured to provide web-enabled applications providing customer access to metering services including billing, energy usage, and statistics comprising current and past energy usage.

12. The electric meter system of claim 11, further comprising a customer mobile application configured to enable the customer access on a mobile laptop computer and/or mobile phone or smart phone to monitor or view at least one parameter of an energy use by a customer.

13. The electric meter system of claim 11, wherein the metering services include a graphical presentation of electric phase voltage and current waveforms.

14. The electric meter system of claim 11, wherein the metering services include access to a display of voltage, current, and phase angle values in real time.

15. The electric meter system of claim 11, wherein the metering services include a store of voltage, current, and phase angle values at a user-specified interval.

16. The electric meter system of claim 7, further comprising RFID tracking configured to form a communication channel or link with an RFID reader.

17. The electric meter system of claim 16, further comprising a home device control configured to couple to one or more appliances.

18. The electric meter system of claim 16, wherein the removable or portable meter is integrated or mounted on a street pole.

19. The electric meter system of claim 18, wherein the street pole includes at least one service powered by the removable or portable meter, the at least one service including at least one of vehicle telemetry information, remote monitoring of charge/discharge within an electric vehicle route, multi-colored street lights, a cellular module, and/or a Wi-Fi modem, a data meter, a sound detector, a gunshot detector, a camera and/or motion detector, and/or a two-way intercom.

* * * * *